(12) United States Patent
Carlisle et al.

(10) Patent No.: US 7,128,889 B2
(45) Date of Patent: Oct. 31, 2006

(54) METHOD TO GROW CARBON THIN FILMS CONSISTING ENTIRELY OF DIAMOND GRAINS 3-5 NM IN SIZE AND HIGH-ENERGY GRAIN BOUNDARIES

(76) Inventors: John A. Carlisle, 15259 Ingersoll, Plainfield, IL (US) 60544; Orlando Auciello, 1 Treehouse Ct., Bolingbrook, IL (US) 60490; James Birrell, 4420 W. 87th St., Chicago, IL (US) 60652

( * ) Notice: Subject to any disclaimer, the term of this patent is extended or adjusted under 35 U.S.C. 154(b) by 75 days.

(21) Appl. No.: 10/845,867

(22) Filed: May 13, 2004

(65) Prior Publication Data
US 2005/0042161 A1    Feb. 24, 2005

Related U.S. Application Data
(60) Provisional application No. 60/482,973, filed on Jun. 26, 2003.

(51) Int. Cl.
*C01B 31/06* (2006.01)
(52) U.S. Cl. ........................ 423/446; 117/101
(58) Field of Classification Search ................ 423/446; 117/101
See application file for complete search history.

(56) References Cited

U.S. PATENT DOCUMENTS

| 5,989,511 | A | 11/1999 | Gruen et al. | |
| 6,592,839 | B1 * | 7/2003 | Gruen et al. | 423/446 |
| 6,793,849 | B1 * | 9/2004 | Gruen et al. | 252/502 |
| 6,811,612 | B1 * | 11/2004 | Gruen et al. | 117/94 |

OTHER PUBLICATIONS

The American Physical Society, Review B, vol. 65, Tight Binding Molecular Dynamics Simulation of Impurities in Ultrananocrystalline Diamond Grain Boundaries, ZOPOL, P., Sternberg M Curtiss L Frauenhiem T and Gruen D 2001-045403-1-11.

* cited by examiner

Primary Examiner—Stuart L. Hendrickson
Assistant Examiner—Alvin Raetzsch
(74) Attorney, Agent, or Firm—Emrich & Dithmar

(57) ABSTRACT

An ultrananocrystalline diamond (UNCD) having an average grain size between 3 and 5 nanometers (nm) with not more than about 8% by volume diamond having an average grain size larger than 10 nm.

A method of manufacturing UNCD film is also disclosed in which a vapor of acetylene and hydrogen in an inert gas other than He wherein the volume ratio of acetylene to hydrogen is greater than 0.35 and less than 0.85, with the balance being an inert gas, is subjected to a suitable amount of energy to fragment at least some of the acetylene to form a UNCD film having an average grain size of 3 to 5 nm with not more than about 8% by volume diamond having an average grain size larger than 10 nm.

9 Claims, 12 Drawing Sheets

METHOD TO GROW CARBON THIN FILMS CONSISTING ENTIRELY OF DIAMOND GRAINS 3-5 NM IN SIZE AND HIGH-ENERGY GRAIN BOUNDARIES

RELATED APPLICATION

This application, pursuant to 37 C.F.R. 1.78(c), claims the benefit of U.S. Provisional Application Ser. No. 60/482,973 filed on Jun. 26, 2003.

CONTRACTUAL ORIGIN OF THE INVENTION

The United States Government has rights in this invention pursuant to Contract No. W-31-109-ENG-38 between the U.S. Department of Energy (DOE) and The University of Chicago representing Argonne National Laboratory.

BACKGROUND OF THE INVENTION

The overarching goal of diamond thin film research is to develop techniques and practices that allow the deposition of films on a variety of substrates that retain most if not all of the outstanding properties of natural diamond (hardness, electron mobility, thermal conductivity, etc.). This work has been going on for many years and has resulted in a number of thin film deposition technologies for growing diamond (>95% crystalline $sp^3$ bonded carbon) films. The two major techniques are plasma enhanced chemical vapor deposition (PECVD, using either RF or microwave frequencies) and hot-filament CVD reactors, although other forms of CVD also exist as well for diamond deposition (i.e. arc-jet and oxyacetylene flame growth.

The previous technology is based on the use of plasma chemistries that grow diamond films with micrometer size gains and low-energy grain boundaries, using a typical gas mixture of 1% $CH_4$. These films are commonly referred to as microcrystalline diamond (MCD), and have a distinct columnar structure where the grain size (and roughness) increase with increasing film thickness. Diamond growth in these films proceeds via chemical reactions at the growing surface wherein a methyl radical adsorbs unto a site following the abstraction of hydrogen from this site. The presence of atomic hydrogen in the plasma is critically needed in order to abstract hydrogen from the surface as well as to etch the non-diamond carbon during growth. These films consist of >99% diamond bonded carbon but are imperfect renderings of diamond as a thin film, suffering from many drawbacks that ultimately limit their commercialization. Many companies setup to commercialize MCD in the early 90's failed as a consequence of these limitations.

Nanocrystalline diamond films (NCD) can be grown by increasing the content of $CH_4$ in the $CH_4/H_2$ plasma to about 4–5%. NCD films, which consist of nanometer-sized grains of diamond ($sp^3$) bonded carbon, have shown some promise as commercially viable carbon coatings, but a key challenge in these films is the control of their nanoscale morphology and uniformity of the bonding structure, so as to retain the properties of natural diamond. These films are often, but not always two-phase materials, with nanometer sized (>50 nm) grains of diamond-bonded carbon imbedded in an amorphous, $sp^2$-bonded carbon matrix. They are consequently not as hard as natural diamond. Additionally, even in the best of cases (phase-pure nanocrystalline diamond films) these films require a very high initial nucleation density in order to form nanometer grains, and the grain size of these films increases with film thickness, limiting the thickness of the NCD films.

Over the past several years work at Argonne National Laboratory (ANL) has lead to the invention of an alternative diamond film technology: Ultrananocrystalline Diamond (UNCD) as described in U.S. Pat. No. 5,989,511, the disclosure of which is incorporated by reference, which is based on a fundamentally different chemistry. UNCD films are typically grown using gas mixtures consisting of 99% Ar with 1% $CH_4$ (a 99/1 plasma) that claims $C_2$ dimers as the species that play a key role in the nucleation of the UNCD films and might contribute to the growth process as well. The $C_2$ dimers are produced by plasma assisted breakdown and reaction of the parent molecules. The so called UNCD films were thought to consist entirely of diamond grains 3–5 nm in size (with crystalline $sp^3$ coordinated carbon atoms) with high-energy, high angle twist grain boundaries (with disordered $sp^2$ coordinated carbon atoms). It is the nanoscale structure of these films that give them a unique combination of material properties, including exceptional hardness, 20 nm rms as deposited roughness, low film stress, low as-deposited friction coefficient, high electronic conductivity when doped with nitrogen or boron, and many other properties.

Recent work, however, has shown that for the 99/1 plasma chemistry most typically used about 10% of the carbon in a UNCD film does not have the UNCD nanoscale bonding structure, but instead consists of large inclusions (~100 nm) of heavily twinned- dendritic inclusions of crystalline $sp^3$-bonded carbon. In short, carbons films grown using 99/1 plasmas are not pure UNCD, but consist of a mixture of UNCD and MCD, with the MCD portion greater than 8% by volume and generally more than 10% by volume of the diamond. The addition of hydrogen to the gas mixture leads to the very rapid increase in the volume fraction of MCD in the films relative to the UNCD component, increasing to 50% MCD for 5% added hydrogen by volume (94% Ar/1% $CH_4$/5% $H_2$) and >90% MCD for 20% added hydrogen. Recent TEM results shown in FIG. 1 dramatically illustrate this UNCD+MCD structure directly. FIG. 1 illustrates differences in a 1% methane plasma with varying added hydrogen. Most of the films grown prior to about 1998 were grown using significant amounts of added hydrogen.

In addition, further recent work has also shown that, when the amount of hydrogen gas is reduced below a certain level, which is dependent to some extent on substrate temperature, as will be explained, the resulting film consists of a large amount of $sp^2$-bonded carbon, and is thus useless for applications that require either nanocrystalline or ultrananocrystalline films nanocrystalline applications.

SUMMARY OF THE INVENTION

The present invention solves the problem of growing thin films of a carbon material of ultrananocrystalline diamond (UNCD), on surfaces of insulator, semiconductor, and/or conductor materials. The present invention is based on the discovery that only for a certain, narrow range of plasma compositions, in which the amount of hydrogen gas is precisely controlled, a film of "pure UNCD" is grown, where "pure UNCD" means that the UNCD film microstructure is characterized by grains of 3–5 nm in size with $sp^3$ bonded carbon atoms, and atomic wide (~0.4 nm) grain boundaries with carbon atoms bonded in $sp^2$, $sp^3$, and other local geometries and wherein the volume percent of microcrystalline diamond (MCD) in the film is less than about 8. This invention therefore serves to identify and describe the synthesis of a "pure UNCD" film.

Accordingly, it is an object of the present invention to provide an ultrananocrystalline diamond film having an average grain size between 3 and 5 nm with up to about 8% by volume diamond having an average grain size greater than 10 nm.

Another object of the present invention is to provide a method of manufacturing an UNCD film comprising forming a vapor of acetylene and hydrogen that is thermally stable at 1000° K in an inert gas other than He wherein the volume ratio of acetylene to hydrogen is greater than 0:35 and less than about 0.85 with the balance being an inert gas, subjecting the vapor to a suitable amount of energy to fragment at least some of the acetylene, and contacting the fragment containing vapor and a substrate, and forming an UNCD film having an average grain size of 3 to 5 nm with not more than about 8% by volume diamond having an average grain size larger than 10 nm on the substrate.

Yet another object of the present invention is to provide a method of manufacturing UNCD film comprising forming a vapor of $C_2H_2$ and $H_2$ in an inert gas of Ar and/or Kr and/or Xe wherein the $C_2H_2$ to $H_2$ to volume ratio is greater than 0.35 and less than 0.85, with the balance being the inert gas, fragmenting a portion of the $C_2H_2$ by providing microwave energy to the vapor, and contacting the vapor containing acetylene fragments and a substrate maintained at a temperature less than about 600° C. to form an UNCD film having an average grain size of 3 to 5 nm with not more than about 8% by volume diamond having an average grain size larger than 10 nm on the substrate.

Still another object of the invention is to provide a method of manufacturing UNCD film, comprising forming a vapor of a carbon containing compound that does not form methyl radicals upon fragmentation and hydrogen that is thermally stable at 1000° K in an inert gas other than He wherein the concentration of hydrogen is less than 1.5% by volume, with the balance being an inert gas, objecting the vapor to a suitable amount of energy to fragment at least some of the carbon containing vapor, and contacting the fragment containing vapor and a substrate, and forming an UNCD film having an average grain size of 3 to 5 nm with not more than 8% by volume diamond having an average grain size larger than 10 nm on the substrate.

A final object of the present invention is to provide a UNCD film made according to the various methods set forth above.

BRIEF DESCRIPTION OF THE DRAWINGS

The invention consists of certain novel features and a combination of parts hereinafter fully described, illustrated in the accompanying drawings, and particularly pointed out in the appended claims, it being understood that various changes in the details may be made without departing from the spirit, or sacrificing any of the advantages of the present invention.

DESCRIPTION OF PREFERRED EMBODIMENT

Figure 1:
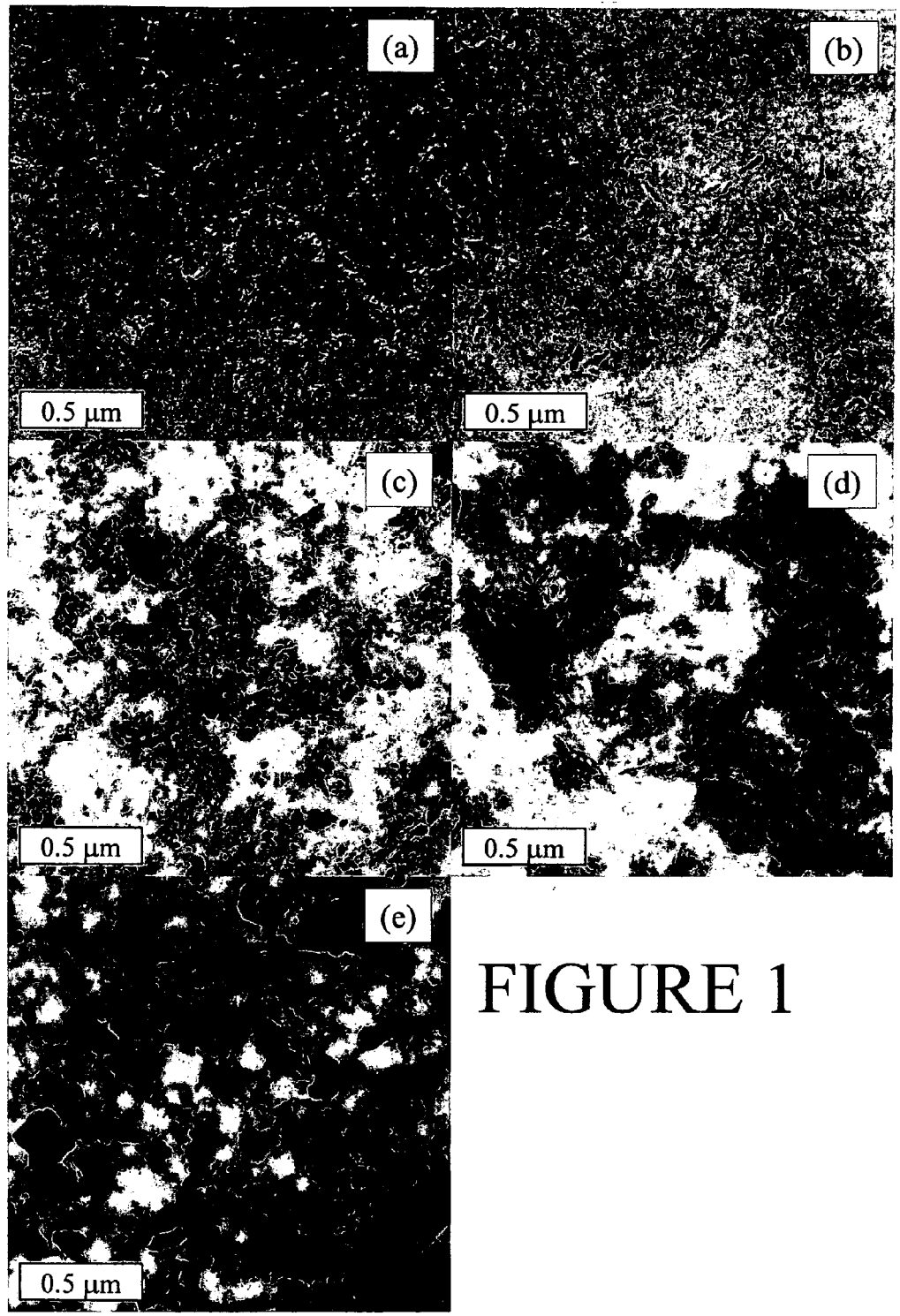
FIGS. 1(a–e) are transmission electron micrographs (TEMs) of prior art UNCD thin films grown in a methane plasma with successive amounts of added hydrogen in the plasma.

The Innovative Plasma Systems GmbH (IPLAS) microwave plasma system has allowed the inventors to examine carbon films grown using acetylene-based (instead of methane-based) plasmas, i.e. using $Ar/C_2H_2/H_2$ gas mixtures. In methane plasmas, the methane thermally decomposes to $C_2H_2$ and $H_2$, so that a 99/1 plasma in facts contains 1.5% $H_2$ (see FIG. 1a) that comes from a combination of the added hydrogen and from the methane. Thus, the amount of $H_2$ in the plasma can be reduced below 1.5% using acetylene-based plasmas.

Figure 2:
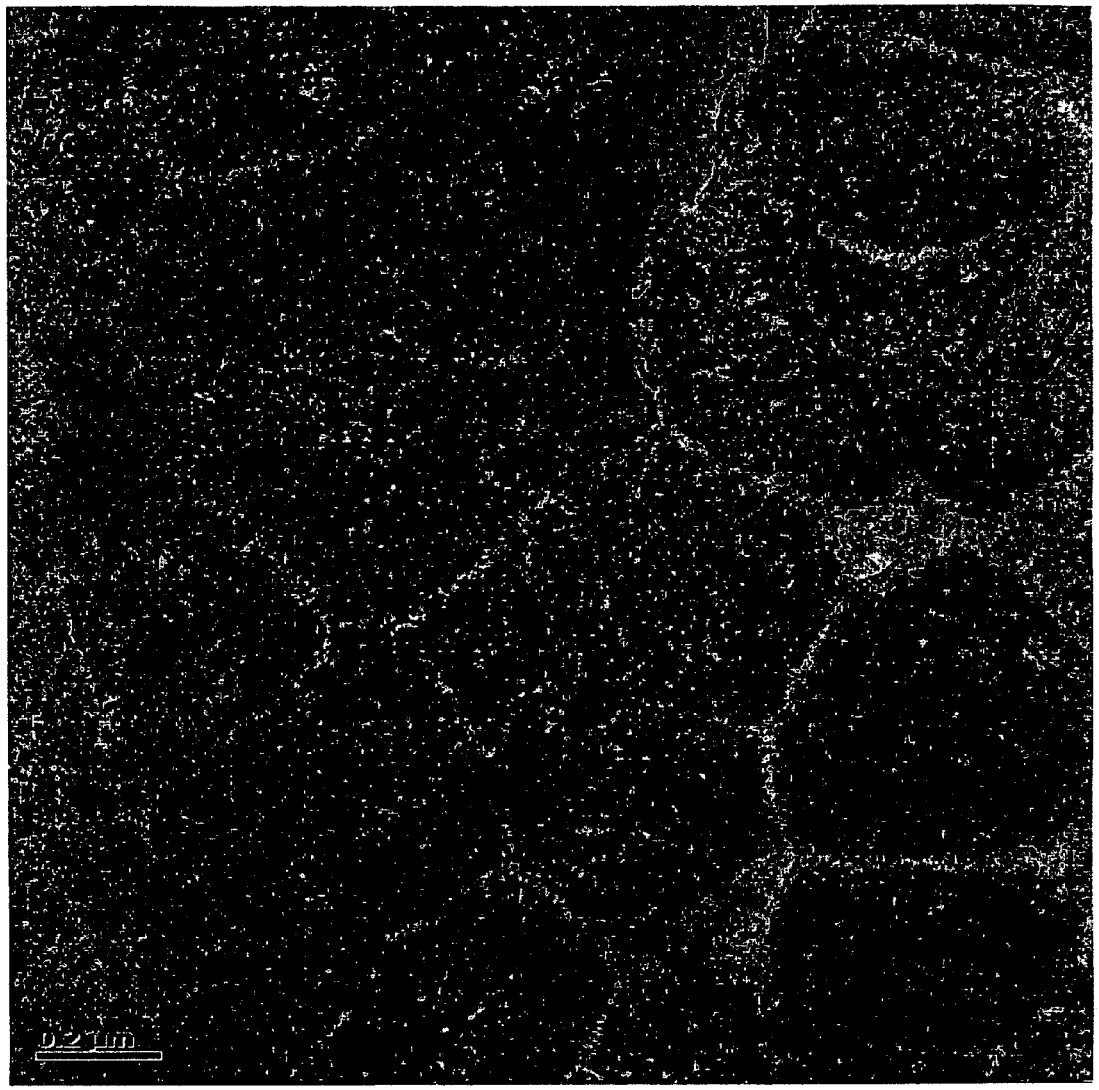
FIG. 2 is a TEM micrograph of a carbon film grown using an argon/acetylene/hydrogen plasma with 0.5% added hydrogen by volume at 800° C.

Recent TEM data obtained from a film grown using a 99% Ar/1% $C_2H_2$/0.5% $H_2$ plasma at 800° C. is shown in FIG. 2, which shows a very different morphology compared with normal UNCD films (FIG. 1a) and illustrates that even with $C_2H_2$ the hydrogen concentrations are very important as the material of FIG. 2 is unsatisfactory.

Figure 3:
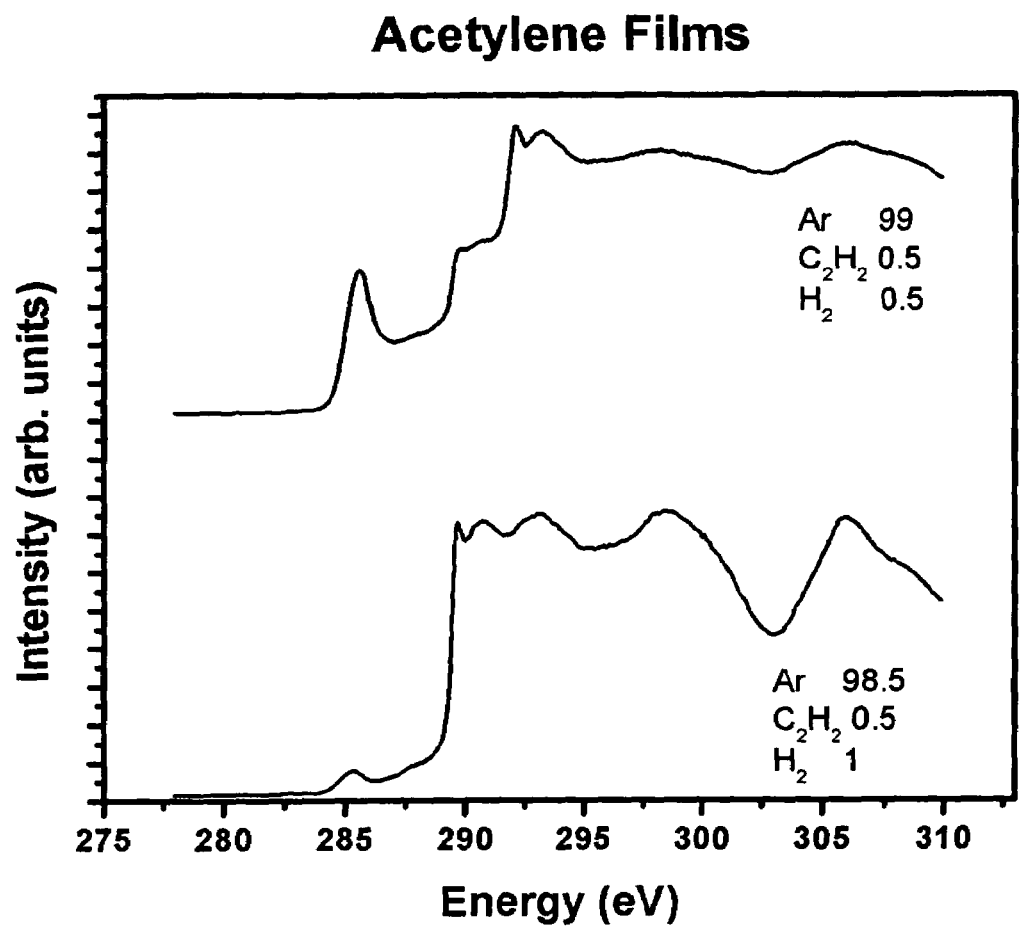
FIG. 3 is a graph of near Edge X-ray Absorption Fine Structure (NEXAFS) taken on a beam line 8.0.1 at the Advanced Light Source (LBNL) showing the change in local bonding structure of the diamond film grown using two different gas mixtures.

FIG. 3 shows x-ray absorption data obtained from two samples grown using the same parameters in every way except the percentage Near Edge X-ray Absorption Fine Structure (NEXAFS) of hydrogen gas in the plasma.

Figure 4:
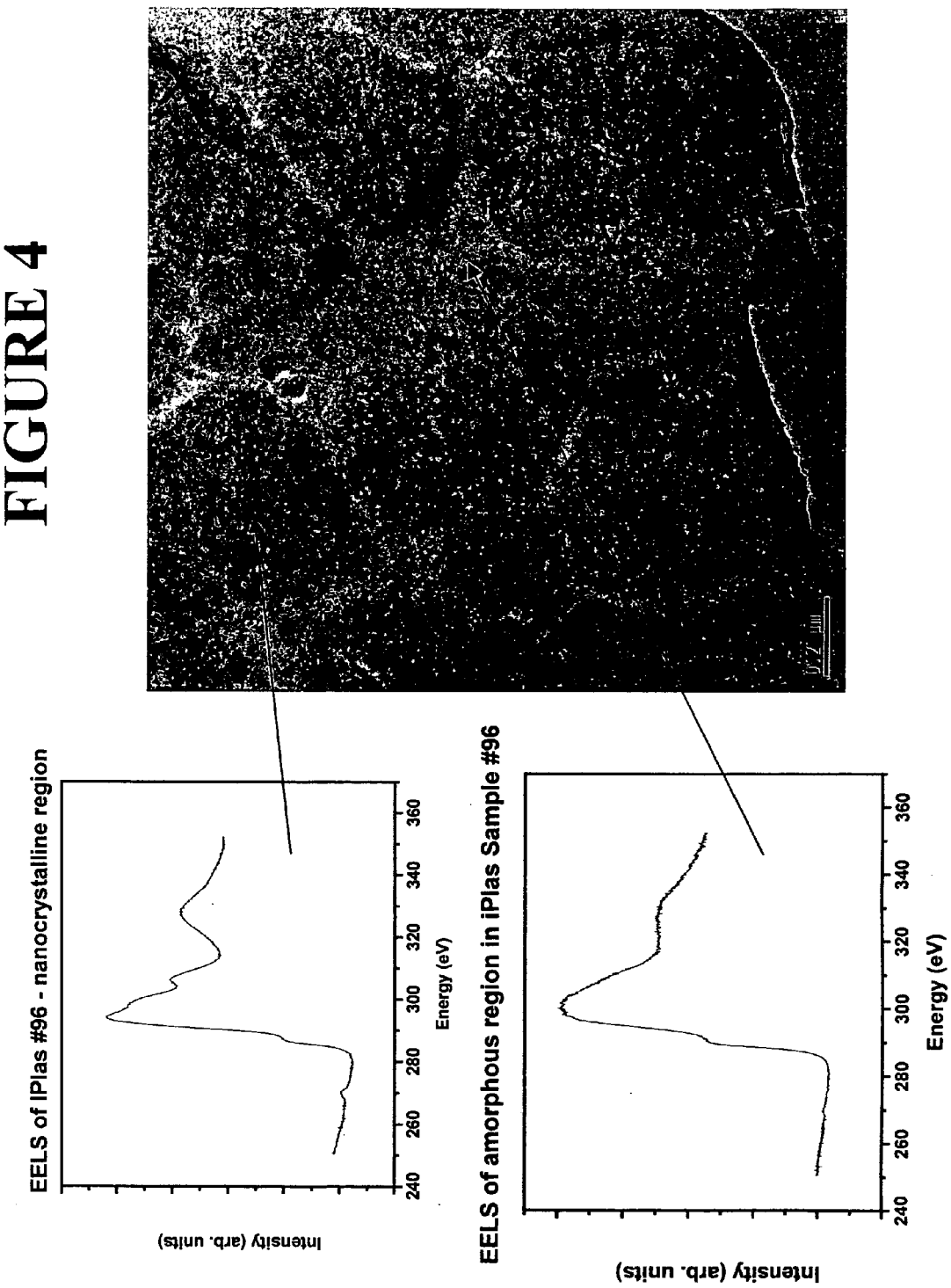
FIG. 4(a–b) are a Electron Energy Loss Spectroscopy (EELS) obtained from the samples shown in FIG. 2 with 4(a) showing the grain region and 4(b) from the grain boundary.

FIG. 4 shows nanoprobe EELS (electron energy loss spectroscopy) data taken from different regions of the film shown in FIG. 2. The grain boundaries (b) consist of mostly disordered $sp^2$-bonded carbon, whereas the grains (a) consist of a mixture of $sp^2$ and crystalline $sp^3$-bonded carbon (i.e. diamond).

The film grown using 98% Ar/1% $C_2H_2$/1% $H_2$ (FIG. 3, bottom graph) shows a spectrum characteristic of normal UNCD, whereas a reduction in the relative percentage of hydrogen to 0.5% leads to a film with a roughly 50/50 mixture of $sp^2$ and $sp^3$ bonded carbon, as previously illustrated in FIGS. 2 and FIGS. 4(a) and (b). Accordingly, it has been found that even when using acetylene as a carbon source only strict control of acetylene and hydrogen concentration produce "pure UNCD" films.

The basis for the present invention is the discovery that only for a certain, narrow range of plasma compositions, in which the amount of hydrogen gas used is finite and is finely controlled, will the growth of a carbon film that is "pure UNCD" occur. This invention includes both "pure UNCD" film and method of making same.

The presence of $C_2$-dimers is a necessary but not a sufficient condition for the growth of a "pure" UNCD film, as seen by the prior art methane based UNCD films. To grow a film consisting of "pure" $sp^3$-bonded diamond grains 3–5 nm in size, and whose grain boundaries are high-energy, high-angle twist grain boundaries, one must:
1. Maximize the amount of material grown through the $C_2$-dimer reaction pathway.
2. Minimize the amount of material grown through the methyl radical ($CH_3$—, $H^+$) reaction pathway.
3. Minimize the amount of $sp^2$-bonded carbon that is not bonded within the grain boundaries.

Use of a noble-gas-based plasma chemistry that leads to the production of $C_2$-dimers, and produces a maximal amount of $C_2$ relative to $CH_3^-$ and other hydrocarbon radicals without significant production of methyl radicals.

Fine control of the amount of hydrogen in the plasma. The presence of a minimal amount of hydrogen gas in the gas mixture should be precisely controlled, depending on temperature and the content of other gases, in order to
stabilize the growing diamond nanocrystals, by terminating the growing diamond surfaces with hydrogen.
promote the formation of $C_2$ dimers in the plasma.
promote the growth of diamond nanocrystals in the 3–10 nm size range.
etch the non-diamond carbon that is not bonded within the grain boundaries, and
stabilize the noble gas discharge.

Growth between 300–800° C. temperatures must be high-enough to promote the $C_2$-dimer reaction pathway but not too high as to desorb the hydrogen terminating the growing diamond surfaces. Since the hydrogen desorption from the growing film is a strong function of temperature, the amount of added hydrogen needed to maintain the hydrogen termination of the surface is dependent on temperature, with less hydrogen needed as the temperature is lowered.

The gas mixture should be precisely controlled so that the soot production in the plasma and reactor is held to a minimum. This involves the fine adjustment of the flow of carbon-source gas relative to the other gases.

The gas mixture, gas flow rates, microwave power, if a microwave power source is used, total pressure, substrate temperature, and other process parameters must also be dynamically controlled in order to maintain the optimal growth of "pure" UNCD.

When acetylene is used in combination with other gases in the plasma, the volume ratio of acetylene to hydrogen should be greater than 0.35 and less than about 0.7 to produce a UNCD film which contains less than about 8% by volume of the larger MCD crystallites. Using acetylene ensures that the least amount of $CH_3$— radical is produced during the manufacture of the inventive "pure UNCD" materials. There is a relationship between the temperature at which the film is grown and the amount of non-diamond carbon produced. Preferably, the substrate temperature at which the acetylene based material is grown is at 600° C. or less. Below 500° C. growth rate diminishes severely, however, growth rates as low as 300° C. are still acceptable, but not necessarily preferred, whereas temperatures as high as 800° C. may be used but are not preferred.

The precise amount of hydrogen needed in the plasma and hence the volume ratio of acetylene to hydrogen is dependant upon the temperature at which the diamond film is grown. For typical UNCD deposition conditions (temp.=800° C.), the amount of added hydrogen in the plasma must be kept >0.5% in order to produce a "pure UNCD" film with no graphitic phase present. As the growth temperature is reduced, the amount of hydrogen needed to produce a "pure UNCD" film decreases to 0.5%, until at 600° C., a "pure UNCD" film is formed under these conditions. The tentative explanation for this is that as the temperature is reduced, the amount of hydrogen thermally desorbed from the growing diamond surface is reduced, allowing for the maintenance of stable diamond nuclei even under the extremely hydrogen-poor conditions found here.

Figure 5:
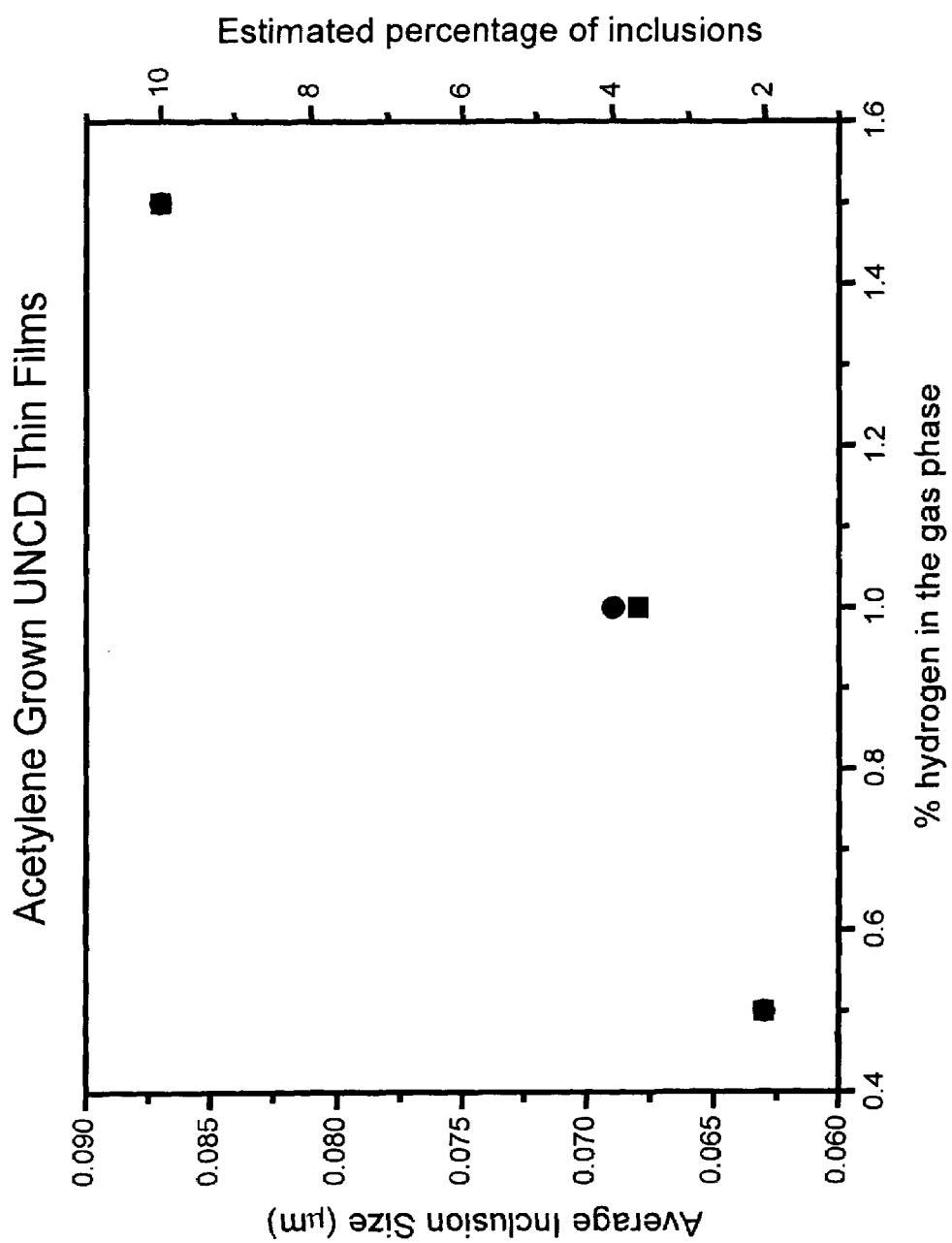
FIG. 5 is a graphical representation of the relationship for acetylene grown UNCD thin films wherein the added hydrogen to the plasma is varied and the average inclusion size and the estimated percentages of inclusions in the films thereof.

FIG. 5 disclose the relationship for acetylene grown UNCD thin films between the percent added hydrogen to the gas phase and the average inclusion size on the left hand Y axis and the estimated percent of inclusions on the right hand Y axis, with the square data points referring to the average inclusion side and the circular data points referring to the estimated percent of inclusions. As seen from FIG. 5, 8 volume percent inclusions resulted from approximately 1.37% added hydrogen in the plasma phase and at about 1.2% added hydrogen there was less than 6 volume percent inclusions.

Figure 6:
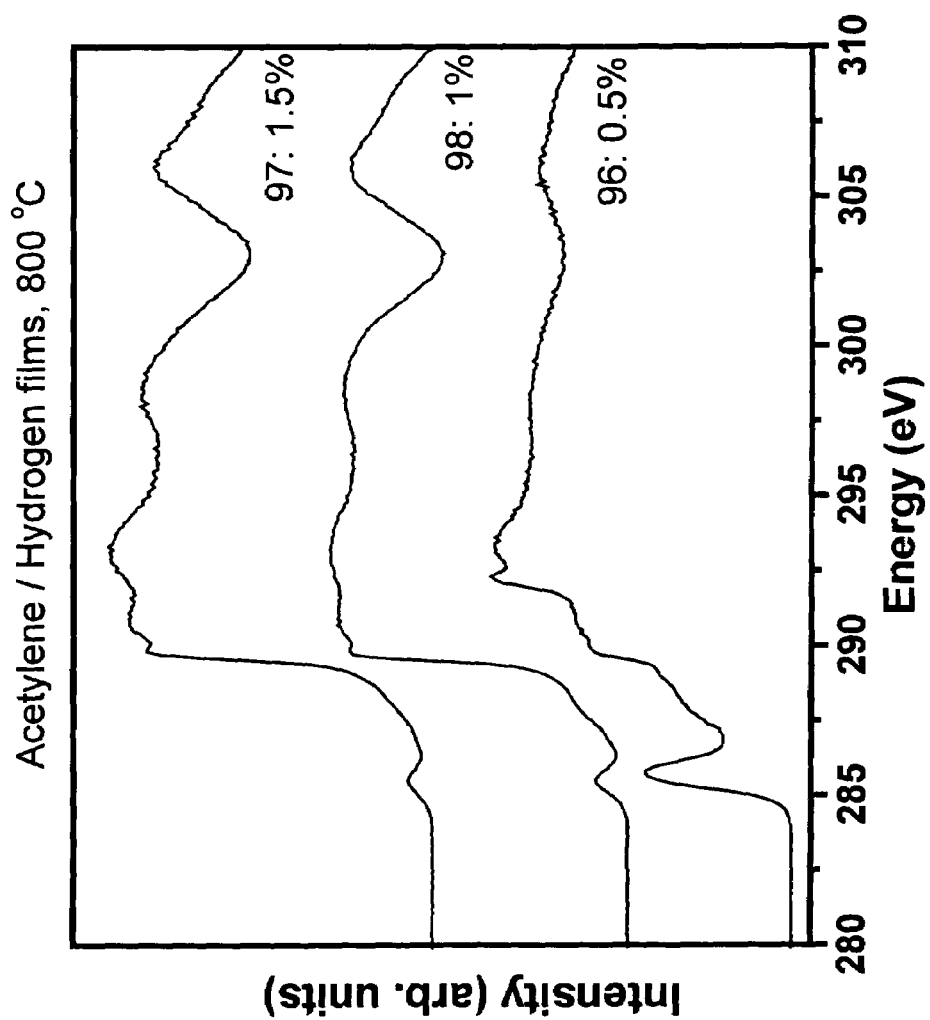
FIG. 6 is a NEXAFS representation of three acetylene films with different hydrogen concentrations grown at 800° C.

The data point at 0.5% added $H_2$ represents about 50% $sp^2$ material (see FIG. 2) which is completely unsatisfactory for UNCD purposes. However, it is believed that approximately 0.75% added hydrogen produces an acceptable "pure UNCD" although it is clear from the data that as the hydrogen content diminishes below about 0.75% hydrogen, the greater the chance that significant amounts of $sp^2$ material is formed. At 1% added hydrogen, a very good material as illustrated in FIGS. 6–11 is formed. FIG. 6 is a NEXAFS graph of 3 acetylene films grown at microwave power of about 850 watts at temperatures of about 800° C. and pressure of 20 millibar. The films were grown over a period of about 3 hours and had thicknesses of 0.45 microns for sample 96, 0.79 microns for sample 97 and 1.1 micron for sample 98. In all cases, temperature refers to the substrate temperature not, of course, the plasma temperature. FIG. 6 shows that there is a significant amount of graphite or -$sp^2$ material at the 285 eV energy level and therefore sample 96 at 0.5% added hydrogen is unsatisfactory material, as previously discussed. Although the NEXAFS data does not distinguish between material in samples 97 and 98, the sample 97 material which is the last data point of 1.5% added hydrogen in FIG. 5 shows that the volume percent of inclusions is approximately 10%, an amount which excludes this material as "pure UNCD" film.

Figure 7:
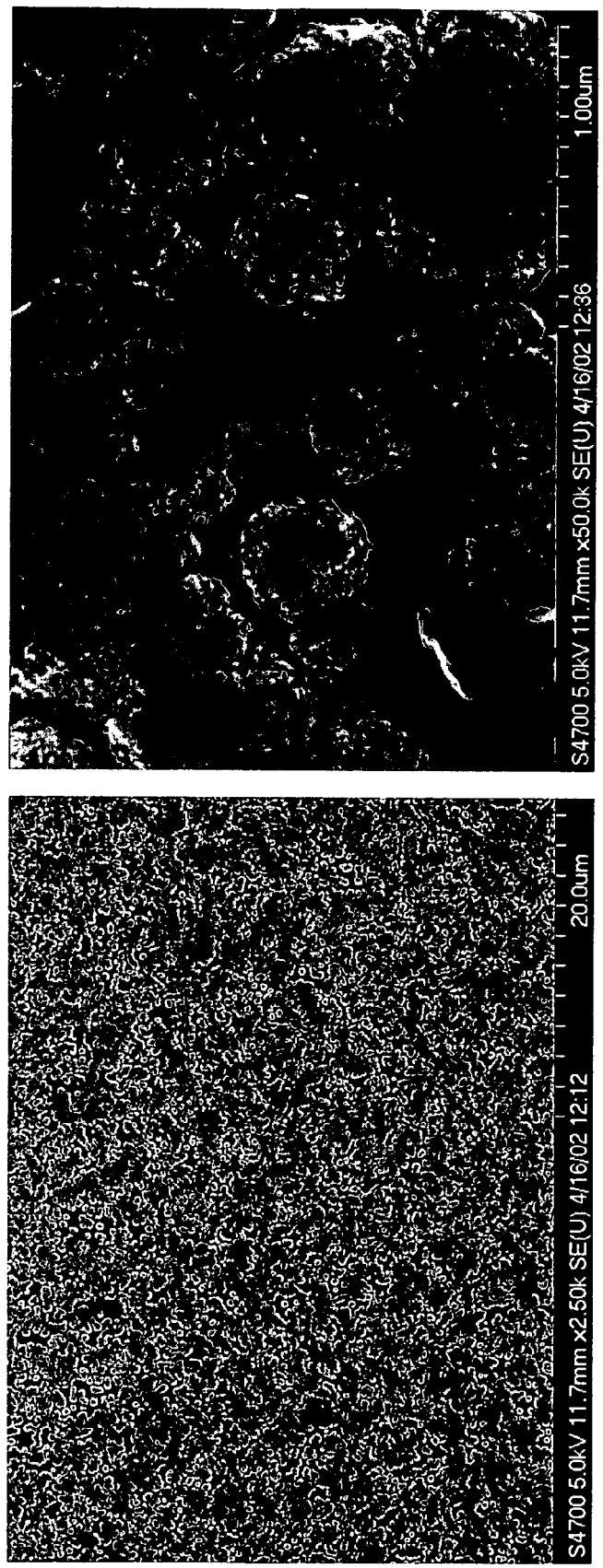
FIGS. 7–9 are SEMs of the surface morphology of the films of FIG. 6.
Figure 8:
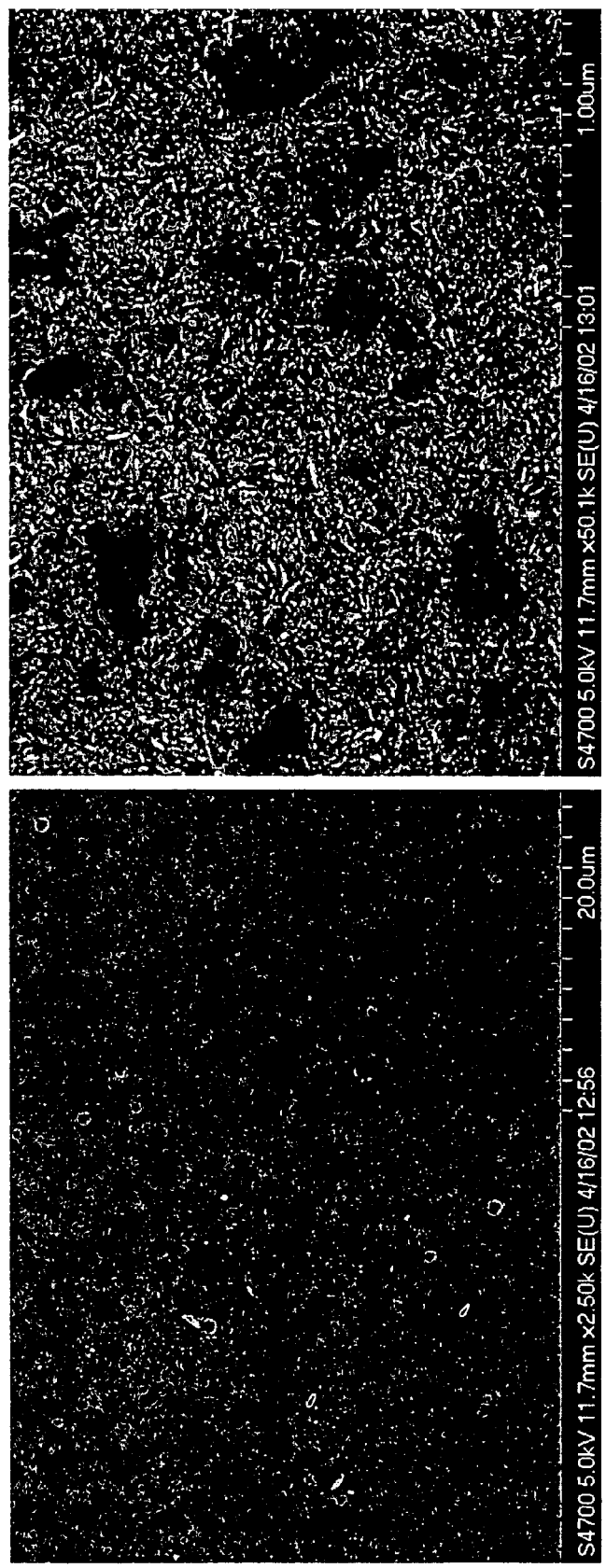
Figure 9:
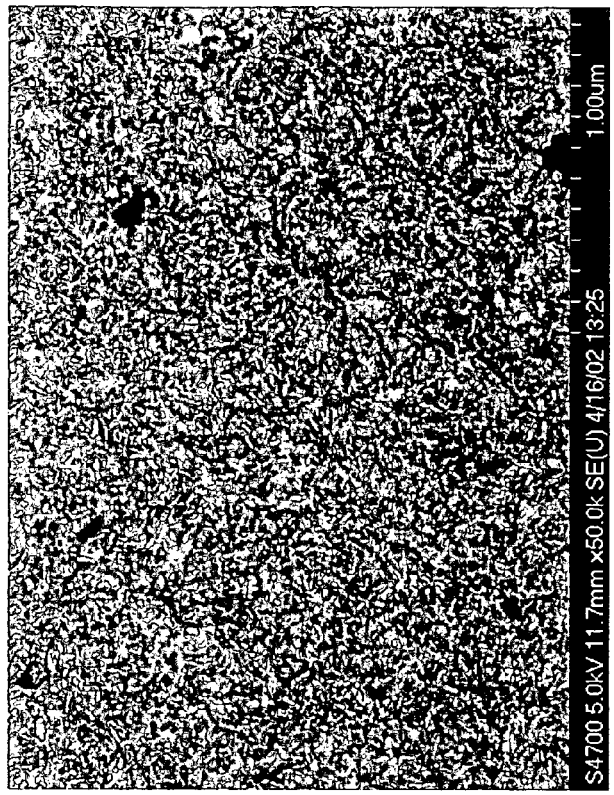
Figure 9:
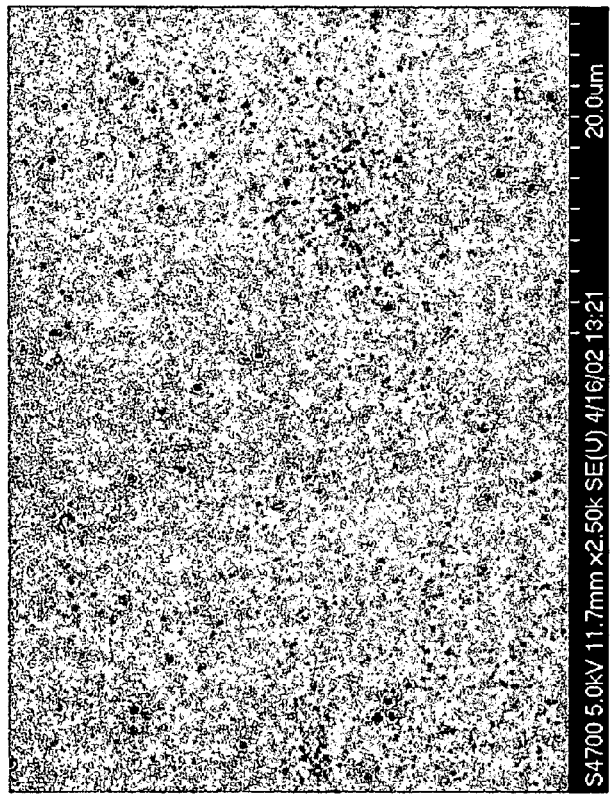

Referring now to FIGS. 7–9, inclusive, there are shown differences in the surface morphology of acetylene UNCD films with hydrogen concentrations of 0.5%, 1.5% and 1%, respectively. As clearly may be seen sample #98, FIG. 9 has the least dark material which is the MCD, while having the most amount of lighter material, "pure UNCD".

Figure 10:
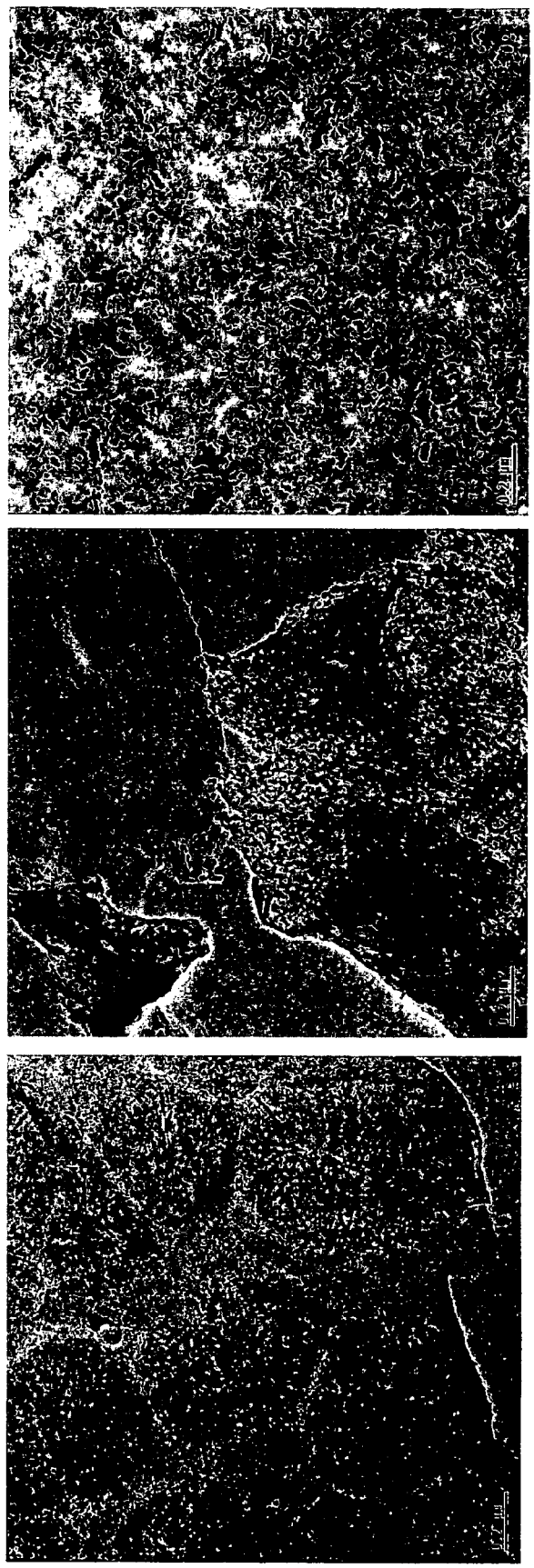
FIG. 10 is a low resolution TEM of the acetylene films illustrated in FIGS. 6–9 at 0.2 micron scale.
Figure 11:
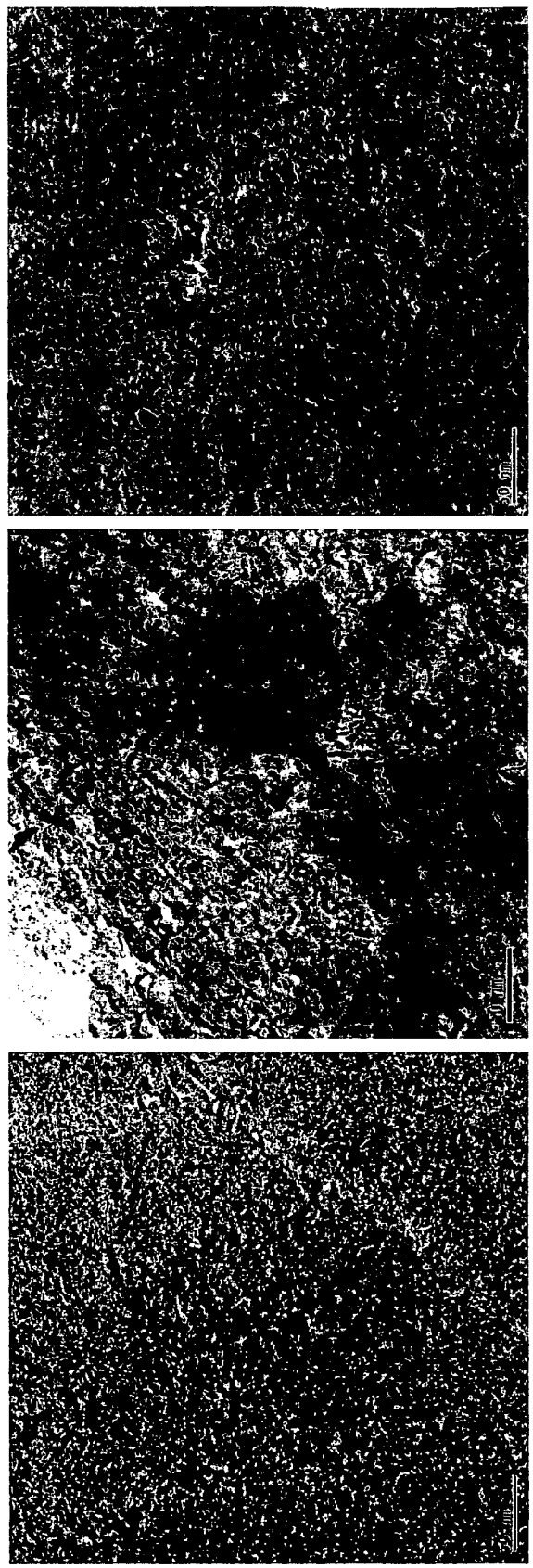
FIG. 11 is a low resolution TEM like FIG. 10 but at a 50 nm scale.
Figure 12:
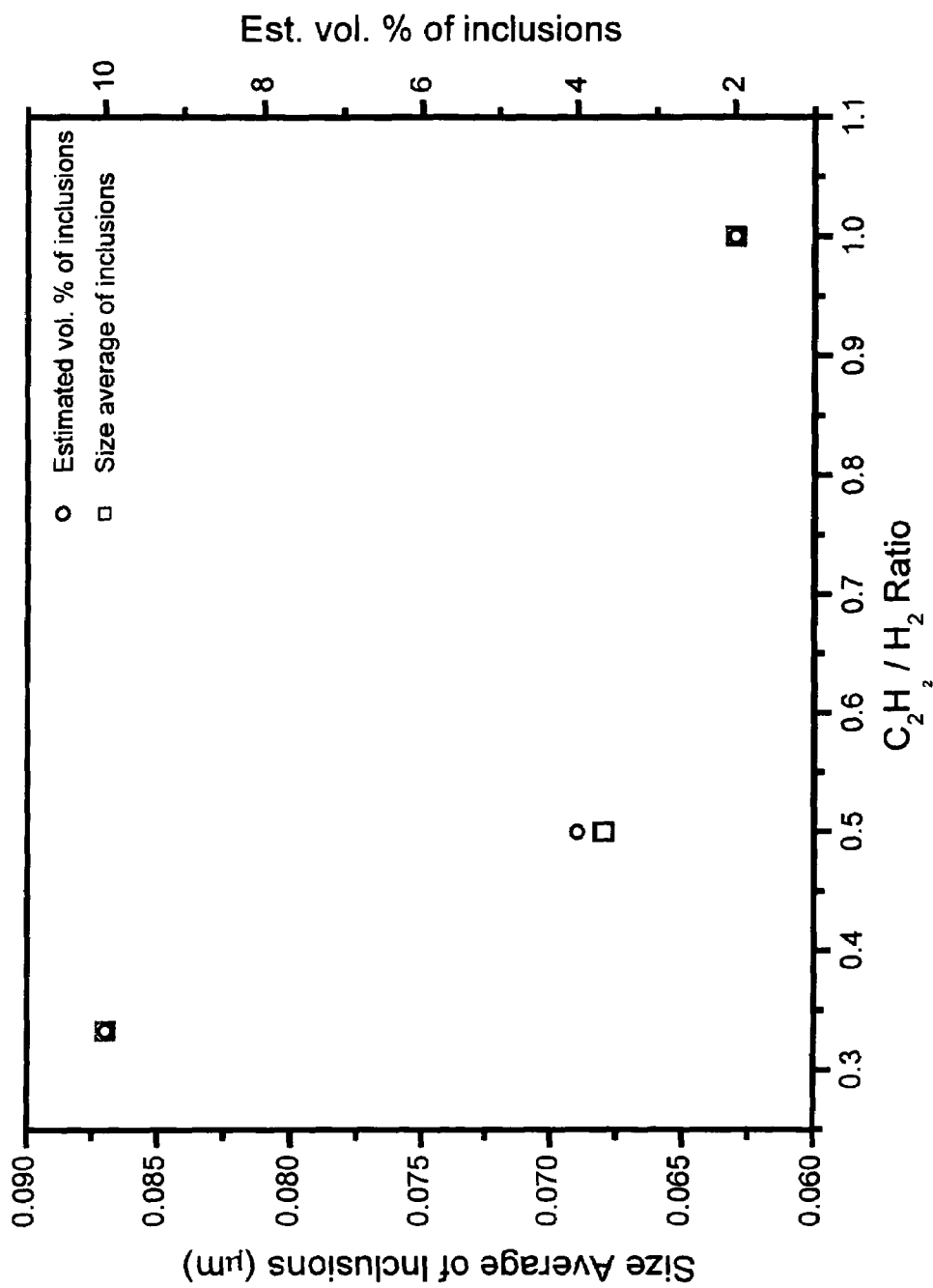
FIG. 12 is a graph like FIG. 5 using the volume ratio of acetylene to hydrocarbon rather than the % hydrogen.

Referring now to FIGS. 10 and 11, there are low resolution TEMs of films for samples 96, 97 and 98, the three data points in FIG. 5. As seen from FIGS. 10 and 11. FIG. 12 is the data of; FIG. 5 expressed as the volume ratio of acetylene to hydrogen for the x-axis rather than the volume percent of hydrogen as in FIG. 5. As can be seen, good films are made for acetylene to hydrogen ratios of greater than 0.35 and less than about 0.85 but the range of 0.35 to 0.7 is preferred. For ratios of about 0.4 films having less than 6% of inclusions greater than 10 nm are produced.

When looking at the TEM images, what we see are areas of brighter regions and darker regions. On closer examination (higher magnification), we can see a difference in the local nanostructure of these regions. While both regions are undoubtedly made up of diamond (i.e. each have the same lattice spacing as (111) diamond), the regions of the darker areas exhibit a nanostructure similar to heavily faulted microcrystalline diamond, in that there are no small grains, just a large grain with a number of different types of defects, such as stacking faults and twinning planes (common in fcc materials). The lighter regions, however, show a much different nanostructure—these areas exhibit the nano-sized grains commonly referred to when discussing UNCD thin films.

The difference in the contrast of these areas of differing structure in the low resolution images is due to the fact that the microcrystalline diamond inclusions more strongly diffract the electron beam than the nanocrystalline diamond regions in this film. This difference in contrast was increased in the electron microscope by inserting an objective aperture into the path of the electron beam, which effectively blocked off more strongly diffracted beams from contributing to the image.

Although the above description of "pure UNCD" films has concentrated on acetylene films grown with microwave induced plasmas, it should be understood that other hydrocarbon compounds that do not readily form methyl radicals such as fullerenes and/or anthracene may be used in the present invention to provide "pure UNCD" film. Moreover, a variety of different power sources and plasmas may be used and the invention is not limited to microwave plasma but includes PECVD using RF as well as hot-filament CVD reactors.

While there has been disclosed what is considered to be the preferred embodiments of the present invention, it is understood that various changes in the details may be made without departing from the spirit, or sacrificing any of the advantages of the present invention The embodiments of the invention in which an exclusive property or privilege is claimed are defined as follows:

1. An ultrananocrystalline diamond (UNCD) film having an average grain size between 3 and 5 nanometers (nm) with not more than about 8% by volume diamond having an average grain size larger than 10 nm.

2. The UNCD film of claim 1, wherein diamond having an average grain size larger than 10 nm is present in an amount less than 6% by volume.

3. The UNCD film of claim 1, wherein diamond having an average grain size larger than 10 nm is present in an amount in the range of from about 3% by volume to not more than about 8% by volume.

4. The UNCD film of claim 1, wherein said UNCD film has grain boundaries of about 0.4 nm.

5. The UNCD film of claim 1, wherein said UNCD film is essentially $sp^3$-bonded diamond.

6. The UNCD film of claim 1, wherein substantially all $sp^2$-bonded carbon present is at the UNCD film grain boundaries.

7. The UNCD film of claim 1, wherein the UNCD film grain boundaries are high energy.

8. The UNCD film of claim 1, wherein the UNCD film grain boundaries are high-angle twist.

9. An UNCD film having average grain size between 3 and 5 nm with diamond having average grain size larger than 10 nm present in the range of from about 3% by volume to not more than 8% by volume and wherein the UNCD film is essentially $sp^3$ bonded diamond and wherein substantially all $sp^2$ bonded carbon present is at the UNCD film grain boundaries.

\* \* \* \* \*